(12) United States Patent
Kodadek, III

(10) Patent No.: US 8,767,398 B2
(45) Date of Patent: Jul. 1, 2014

(54) THERMAL MANAGEMENT SYSTEM FOR ELECTRICAL COMPONENTS AND METHOD OF PRODUCING SAME

(75) Inventor: Robert E. Kodadek, III, Long Beach, NY (US)

(73) Assignee: Black Tank LLC, Amesbury, MA (US)

( * ) Notice: Subject to any disclaimer, the term of this patent is extended or adjusted under 35 U.S.C. 154(b) by 410 days.

(21) Appl. No.: 13/021,344

(22) Filed: Feb. 4, 2011

(65) Prior Publication Data

US 2011/0194258 A1      Aug. 11, 2011

Related U.S. Application Data

(60) Provisional application No. 61/301,804, filed on Feb. 5, 2010.

(51) Int. Cl.
*H05K 7/20* (2006.01)
(52) U.S. Cl.
USPC ....... 361/689; 361/679.49; 361/761; 361/767
(58) Field of Classification Search
USPC ............... 361/679.46–679.54, 688–720, 752, 361/760–761, 767, 831
See application file for complete search history.

(56) References Cited

U.S. PATENT DOCUMENTS

| | | | |
|---|---|---|---|
| 6,428,189 B1 | 8/2002 | Hochstein | |
| 6,490,159 B1 * | 12/2002 | Goenka et al. | 361/700 |
| 6,815,724 B2 | 11/2004 | Dry | |
| 7,198,386 B2 | 4/2007 | Zampini et al. | |
| 7,270,446 B2 | 9/2007 | Chang et al. | |
| 7,345,320 B2 | 3/2008 | Dahm | |
| 2004/0264195 A1 | 12/2004 | Chang et al. | |
| 2007/0139895 A1 | 6/2007 | Reis et al. | |
| 2008/0266885 A1 | 10/2008 | Sun et al. | |
| 2008/0278917 A1 | 11/2008 | Lin et al. | |

FOREIGN PATENT DOCUMENTS

| | | |
|---|---|---|
| CN | 2878909 Y | 3/2007 |
| JP | 10097196 | 4/1998 |
| JP | 10293540 | 11/1998 |
| JP | 2009-231135 | 10/2009 |

OTHER PUBLICATIONS

Office Action dated Mar. 4, 2014 in Japanese Application No. 2012-552102.

* cited by examiner

*Primary Examiner* — Courtney Smith
(74) *Attorney, Agent, or Firm* — Brooks Kushman P.C.

(57) ABSTRACT

A thermal management system for an electrical component includes a printed circuit board (PCB) capable of receiving the electrical component on a first side of the PCB. An elongate member has one end attached to a second side of the PCB, and another end disposed away from the PCB. The elongate member also has an open interior that facilitates fluid communication between the two ends. One of the ends defines an at least partially closed boundary on the PCB. The PCB includes an aperture disposed therethrough proximate the boundary such that fluid communication is facilitated between the first side of the PCB and the second side of the PCB, and along at least a portion of the elongate member.

21 Claims, 7 Drawing Sheets

THERMAL MANAGEMENT SYSTEM FOR ELECTRICAL COMPONENTS AND METHOD OF PRODUCING SAME

CROSS-REFERENCE TO RELATED APPLICATIONS

This application claims the benefit of U.S. provisional application No. 61/301,804 filed 5 Feb. 2010, which is hereby incorporated herein by reference.

TECHNICAL FIELD

This invention relates to a thermal management system for electrical components and a method of producing such a system.

BACKGROUND

Products today increasingly utilize a variety of electrical components to control and add functionality to the products. In some cases, a number of electrical components may be mounted on a printed circuit board (PCB), which is often packaged in a relatively small space. A common problem encountered with products of this type, is the buildup of heat from the various electrical components. Inadequate dissipation of the heat generated by the electrical components can lead to a reduced usable life span for the electrical components, and even complete product failure. Thus, a need exists for a thermal management system for electrical components that addresses this problem.

SUMMARY OF THE INVENTION

Embodiments of the present invention include a thermal management system for an electrical component. The system includes a PCB capable of receiving the electrical component on a first side of the PCB. An elongate member includes one end attached to a second side of the PCB, and another end disposed away from the PCB. The elongate member also includes an open interior facilitating fluid communication between the two ends. The one end attached to the second side of the PCB defines an at least partially closed boundary on the PCB. The PCB includes an aperture disposed therethrough proximate the boundary such that fluid communication is facilitated between the first side of the PCB and the second side of the PCB, and along at least a portion of the elongate member.

The PCB is capable of receiving the electrical component at a predetermined location on the first side of the PCB directly opposite at least a portion of the boundary defined on the second side of the PCB. The end of the elongate member that is attached to the PCB may be attached with a heat conductive material to facilitate conductive heat transfer from the electrical component through the PCB and into the elongate member. The PCB may also include a plurality of holes disposed therethrough, each having a smaller diameter than the aperture. The holes may be disposed proximate the predetermined location for the electrical component to facilitate heat transfer from the electrical component to the elongate member.

Embodiments of the invention may include a housing having at least one interior wall and having the PCB disposed therein. A fan may be disposed within the housing such that it is operable to move air through the aperture in the PCB and, where the aperture is at least partially within the boundary, through the interior of the elongate member. Alternatively, the air may move along an outside surface of the elongate member if the aperture is wholly disposed outside the boundary. In some embodiments a control board may be operatively connected to the PCB for controlling the electrical component. The control board can be disposed within the housing such that at least one fluid duct is formed between a respective edge of the control board and a corresponding interior wall of the housing. This allows air moved by the fan to exit the housing after traversing the at least one fluid duct.

Embodiments of the invention include a thermal management system for an electrical component that includes a PCB having at least one of the electrical components surface mounted on a first side of the PCB. At least one mounting pad is disposed on a second side of the PCB directly opposite at least one of the electrical components. At least one elongate member is surface mounted along a respective mounting pad and includes a respective open interior facilitating fluid communication therethrough. The PCB includes at least one aperture disposed therethrough proximate at least one respective mounting pad such that fluid communication is facilitated between the first side of the PCB and the second side of the PCB, through the at least one aperture, and along at least a portion of at least one respective elongate member.

At least some of the electrical components may include a light emitting diode (LED) and a housing into which the PCB is mounted. A fan within the housing can be employed to move air from a front of the PCB where the LED's are surface mounted, through respective apertures, and through respective elongate members mounted on the second side of the PCB, where the apertures are disposed at least partially within a respective mounting pad or mounting pads. Alternatively, the air may be moved along an outer surface of the respective elongate members where the apertures are disposed wholly outside the mounting pads. The elongate members may be generally tubular structures having cross sections that form a closed polygon. Alternatively, the elongate members may be configured as open channels, such that their cross sections are open two-dimensional figures, rather than closed polygons.

Embodiments of the invention also include a method for producing a thermal management system for an electrical component that is attachable to a PCB at a predetermined location on a first side of the PCB. The method may include the steps of attaching a first end of an elongate member on a second side of the PCB opposite the predetermined location. The first end may define an at least partially closed boundary on the first side of the PCB. The elongate member includes a second end disposed away from the PCB, and also includes an open interior facilitating fluid communication between the two ends. The method also includes the step of disposing an aperture through the PCB proximate the boundary such that fluid communication is facilitated between the first side of the PCB and the second side of the PCB, and along at least a portion of the elongate member. The step of attaching the first end of the elongate member on the second side of the PCB may include surface mounting the first end of the elongate member along a heat conductive mounting pad.

The PCB may then be disposed within a housing, and a fan disposed within the housing in a position whereby the fan is operable to move air through the aperture and through the interior of the elongate member, or along an outside surface of the elongate member, or both. The housing may include an interior space at least partially defined by a plurality of interior walls. The method may also include the step of configuring a control board to be disposed within the housing such that the control board has at least one edge configured to cooperate with a respective interior wall of the housing to form a fluid duct.

DETAILED DESCRIPTION

Figure 1:
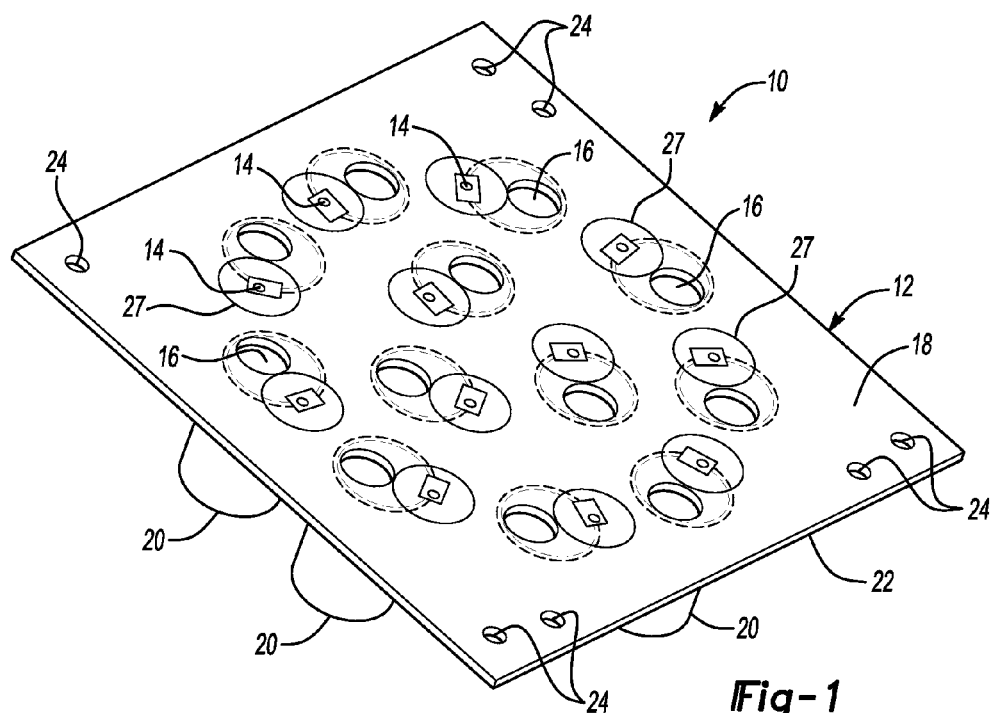
FIG. 1 is a perspective view of a thermal management system in accordance with an embodiment of the present invention as applied to a plurality of electrical components surface mounted on a PCB.

FIG. 1 shows a thermal management system 10 in accordance with an embodiment of the present invention. The system includes a PCB 12 having a plurality of electrical components 14 mounted thereon (for clarity, not all of the electrical components shown in FIG. 1 are labeled). In the embodiment shown in FIG. 1, the electrical components 14 are LED's that are surface mounted to the PCB 12. Corresponding to each of the LED's 14 is a respective aperture 16. The apertures 16 are disposed through the PCB to facilitate the movement of air therethrough.

Each of the LED's 14 are mounted on a first side 18 of the PCB 12. As further illustrated and described in detail below, the thermal management system 10 of the present invention also includes a plurality of elongate members 20 that are mounted to a second side 22 of the PCB 12. The PCB 12 also includes a plurality of mounting holes 24, which can be used to, for example, mount the PCB 12 within a housing.

Figure 2:
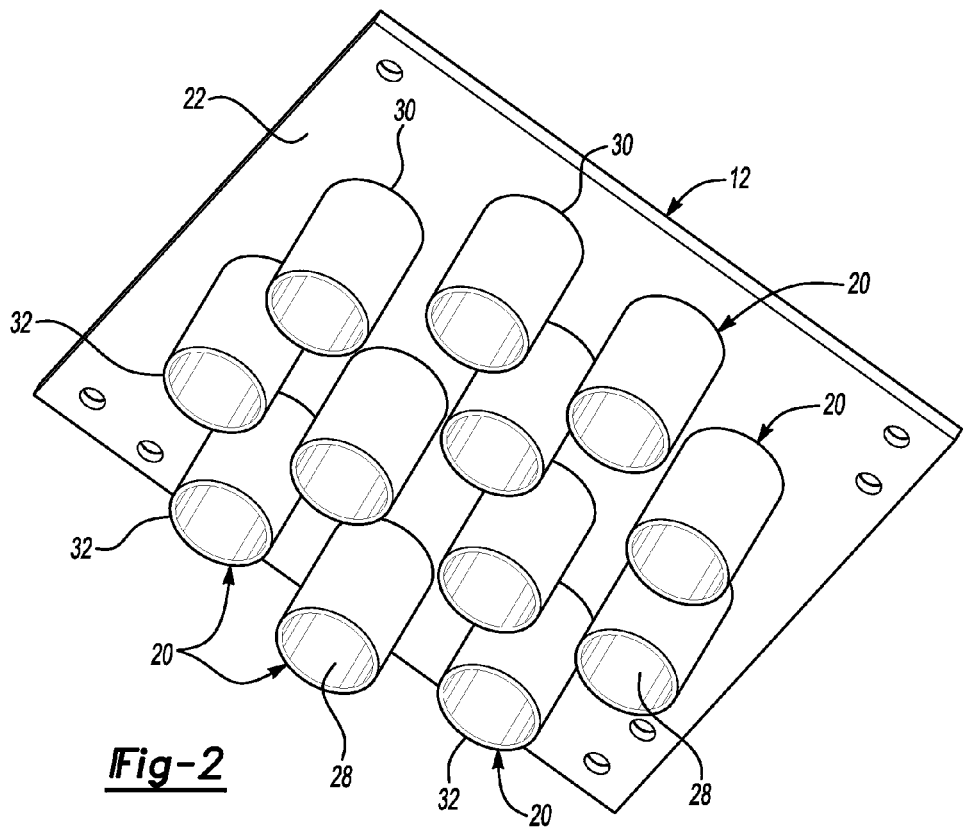
FIG. 2 is a perspective view of an underside of the PCB shown in FIG. 1.

FIG. 2 illustrates an underside of the PCB 12 shown in FIG. 1. As more clearly illustrated in FIG. 2, the elongate members 20 are configured as tubular members, and specifically right circular cylinders. It is understood that the elongate members 20 can have different configurations, such as being tubular members with non-circular cross sections, or even open channels, whereby the cross section is not a closed polygon. In the embodiment shown in FIG. 2, the tubular members 20 have a cross-sectional diameter of approximately ½-¾ inches and a length of approximately one inch. With this configuration for the tubular members 20, the apertures 16—see FIG. 1—may have a diameter of approximately ¼-⅜ inches.

Figure 3:
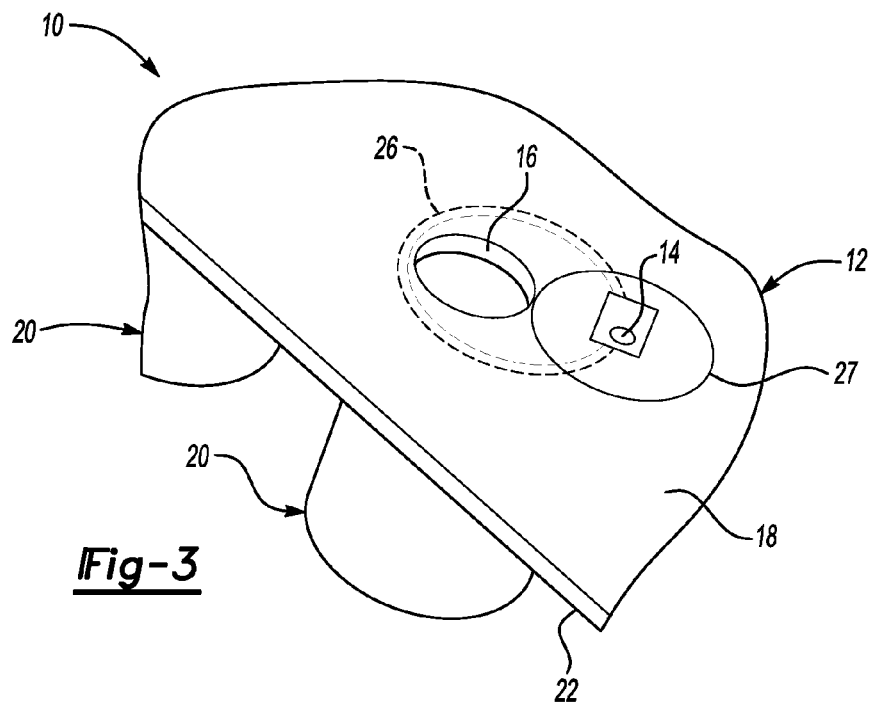
FIG. 3 is a detailed view of a portion of the thermal management system shown in FIG. 1.

FIG. 3 shows a portion of the thermal system 10 in detail. Specifically, FIG. 3 shows one of the LED's 14 surface mounted on the first side 18 of the PCB 12. Also illustrated is an aperture 16 which is shown to be through the PCB 12. Illustrated as hidden lines is a mounting pad 26 that is disposed on the second side 22 of the PCB 12 for mounting a corresponding elongate member 20 to the PCB 12. The mounting pad 26 may generally conform to the outline of a cross section of the elongate member 20, and in such case may be called a "trace"; however, it may include a larger area beyond the outline and is therefore referred to more generically as a "mounting pad". The mounting pad 26 can be made from a heat-conductive material, such as solder, copper, or a heat-conductive polymeric adhesive, just to name a few. Also shown in FIG. 3, and in FIG. 1, are construction line circles 27, which show the location of the LED's 14 relative to the apertures 16.

As shown in FIG. 3, the LED 14 is disposed on the first side 18 of the PCB at a predetermined location that is directly opposite the mounting pad 26, which is disposed on the second side 22 of the PCB 12. This positioning facilitates conductive heat transfer from the LED 14 through the PCB 12 and into the mounting pad 26. Because the tubular member 20 is also made from a heat-conductive material, for example, a copper alloy, heat generated by the LED 14 can be conducted through the PCB 12 and into the tubular member 20. As described in detail below, embodiments of the present invention may employ one or more fans to facilitate air movement through the aperture 16 and through an interior 28—see FIG. 2—of the tubular member 20. Thus, as shown in FIG. 2, the tubular members 20 may have first ends 30 attached to the second side 22 of the PCB 12, and have second ends 32 disposed away from the PCB 12 and generally open to an ambient environment. The open interiors 28 facilitate fluid communication between the ends 30, 32, for example, the movement of air as described above in conjunction with FIG. 3.

Figure 4:
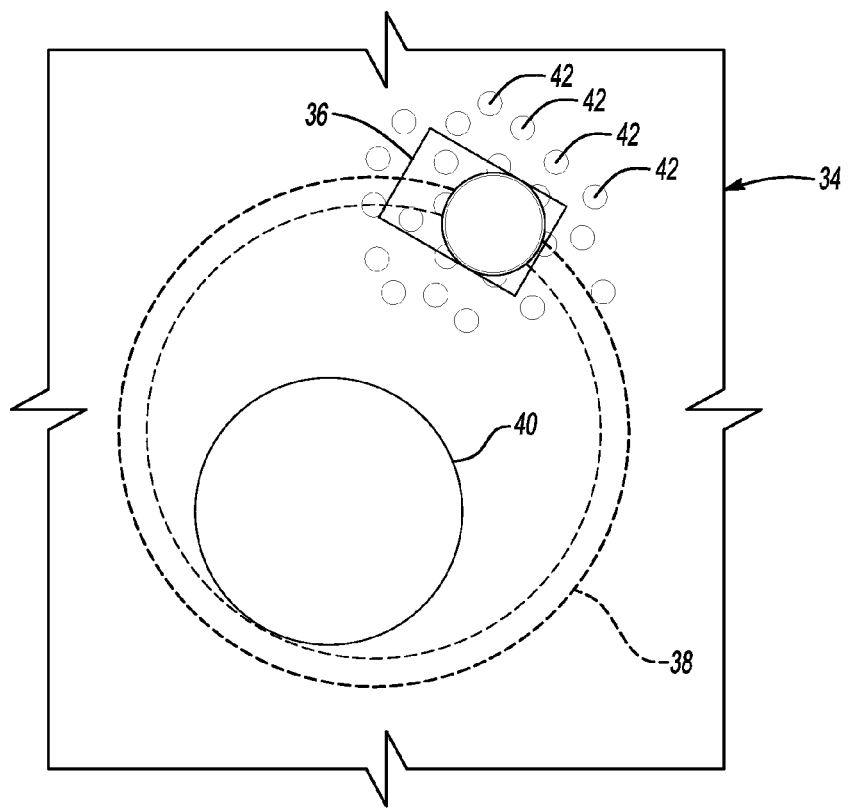
FIG. 4 is a plan view of a portion of a thermal management system in accordance with another embodiment of the invention.

FIG. 4 shows a partially fragmentary plan view of a PCB 34 having an electrical component 36 surface mounted thereon. The electrical component 36 is an LED, and it is mounted on one side of the PCB 34 directly opposite a mounting pad 38 on the other side of the PCB 34. As described above, the mounting pad 38 can be made from a heat-conductive material and used to attach a heat-conductive structure, such as a tubular member 20. As shown in FIG. 4, the mounting pad 38 forms a closed boundary on the PCB 34. In this example, the mounting pad 38 is in the shape of a circle, which may be conveniently used to attach tubular members formed as right circular cylinders. Conversely, elongate members attached to a PCB in accordance with embodiments of the present invention may have non-circular cross sections, they may be configured as open channels, or both. In such a case, the corresponding mounting pad will form a partially closed boundary on the surface of the PCB, rather than a closed polygon.

Also shown in FIG. 4 is an aperture 40 disposed through the PCB 34 and located within the mounting pad 38. It is understood that apertures, such as the aperture 40, may have non-round shapes, and may be only partially within the boundary formed by a mounting pad. In such a case, some of the air moving through the PCB via the aperture would flow through the interior of the corresponding elongate member, while some of the air moving through the same aperture would flow on an exterior portion of the elongate member. As described below, such apertures may be disposed proximate a respective elongate member such that air moving through the apertures flows along an outside surface of the respective elongate members.

Also shown in FIG. 4 is a plurality of holes 42 disposed through the PCB 34. The holes 42 are of a smaller diameter than the aperture 40, and are located in the general vicinity of the LED 36. Holes such as these are sometimes referred to as "via holes" or "stitching". The holes 42 located in close to proximity to the LED 36 allow for increased heat transfer from the LED 36 through the PCB 34 and into the tubular member attached to the mounting pad 38. It is worth noting that although a single LED 36 is located on the mounting pad 38, and a similar one-to-one ratio of electrical components to elongate members is shown in FIGS. 1-3, embodiments of the present invention may provide a single elongate member positioned opposite more than one electrical component such that heat can be dissipated from multiple electrical components with a single heat dissipater, such as the tubular member 20. In addition, a single elongate member may be served by more than one aperture, and a single aperture may provide airflow for more than one elongate member.

Figure 5:
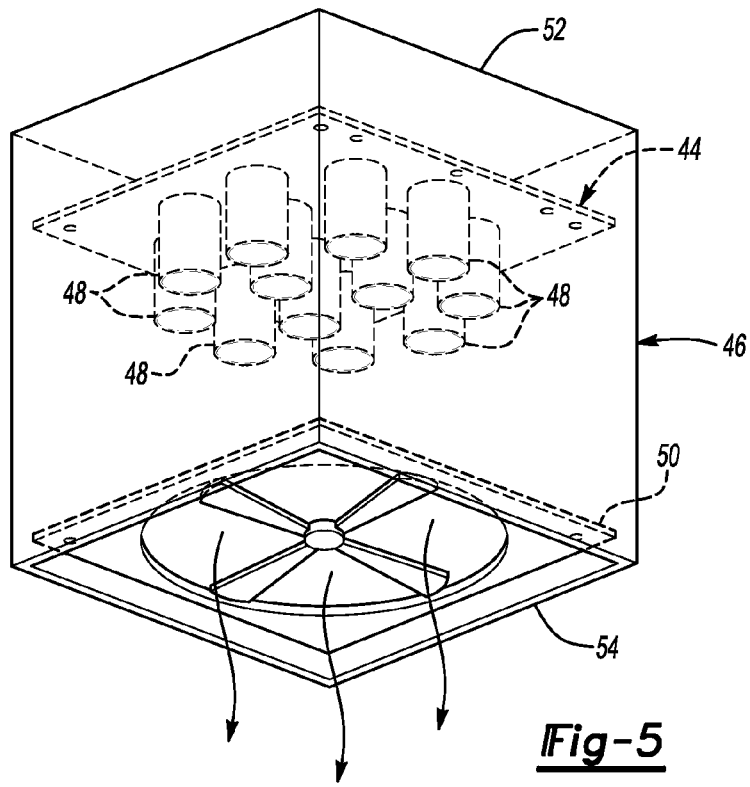
FIG. 5 is a perspective view of a thermal management system in accordance with an embodiment of the present invention, including a housing and a fan for facilitating air movement through the housing.

FIG. 5 shows an embodiment of the present invention wherein a PCB 44 is disposed within a housing 46. A plurality of heat conducting elongate members 48 are disposed on one side of the PCB 44, while electrical components (not shown) are disposed directly opposite the tubular members 48 on the other side of the PCB 44. Also disposed within the housing 46 is a fan 50, which is operable to move air—see directional arrows—through the apertures (not shown in FIG. 5, see, for example, FIG. 1 with apertures 16) and out of the housing 46. The PCB 44 is made from a non-metal core material, such as fiberglass, which is possible because of the thermal management system of the present invention. Metal core PCB's are more expensive and add weight to a device as compared to some other materials such as non-metal core fiberglass. Thus, at least some embodiments of the present invention provide the additional advantages of reduced weight and component cost because they do not require a metallized PCB to dissipate heat.

Figure 6:
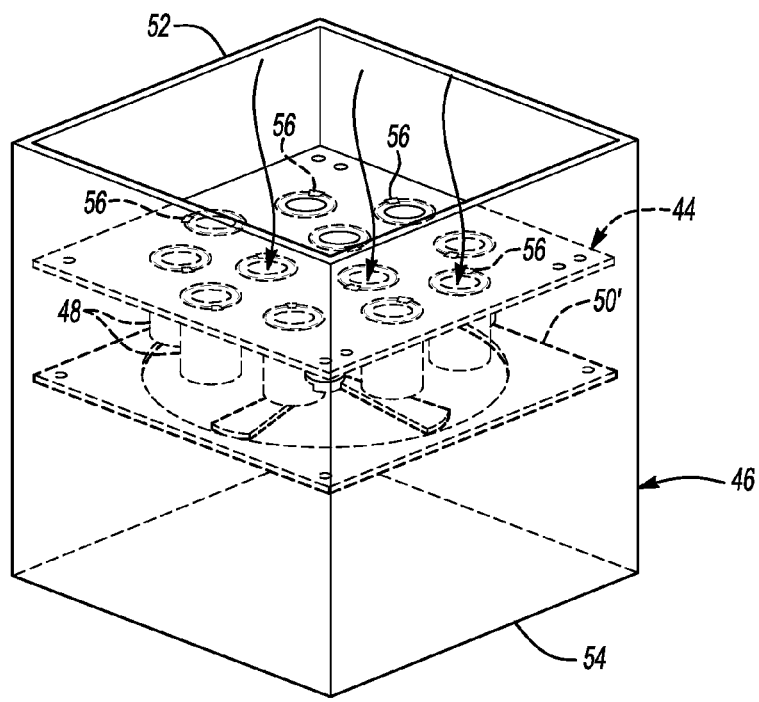
FIG. 6 is a perspective view of an embodiment of the present invention having the fan in an alternate location as compared to FIG. 5.

The housing 46 shown in FIG. 5 is oriented such that a front portion 52 of the housing 46 is shown at the top of the illustration, while a rear portion 54 of the housing 46 is shown at the bottom of the illustration. Thus, air is moved from the front 52 of the housing 46 across the electrical components on one side of the PCB 44, through the PCB 44 and the tubular members 48, and out the rear portion 54 of the housing 46. This is also illustrated in FIG. 6, where a fan 50' has been positioned much closer to the tubular members 48 than the configuration shown in FIG. 5. Adjusting the size and location of a fan, such as the fan 50 or 50', allows flexibility for packaging and the amount of cooling desired in the thermal management system.

Although the embodiments illustrated in the drawing figures show the fans pulling air from a front of the housing and exhausting it out of a rear portion of the housing, a fan may also push air across and/or through the elongate members, through apertures in the PCB and toward the front of the PCB. Depending on the application—e.g., packaging considerations, etc.—a fan may be configured to blow perpendicularly to the back of the elongate members, thereby creating a Venturi effect whereby air is pulled from the front of the PCB, through the apertures, and through the elongate members.

Also shown in FIG. 6 are the LED's 56 attached to the front side of the PCB 44. With this type of arrangement, the open front portion 52 of the housing 46 allows light from the LED's 56 to illuminate a space outside of the housing 46, while the open rear portion 54 of the housing 46 allows air passing over the tubular members 48 to exit the housing 46 to avoid build-up of heat.

Figure 7:
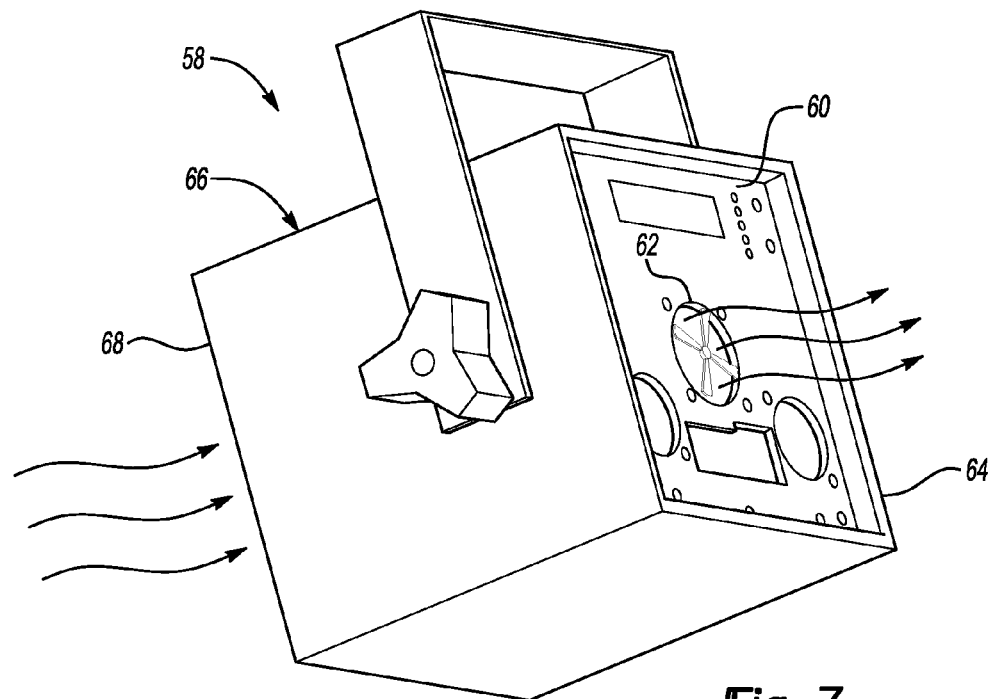
FIG. 7 is a perspective view of an embodiment of the present invention including a control board disposed at the back side of a housing and configured to allow the movement of air therethrough.

FIG. 7 shows an LED light box 58 such as may be used in commercial, industrial, residential, or entertainment applications. The light box 58 employs a plurality of LED's, such as shown in FIG. 6. It also employs a thermal management system, such as illustrated and described above. In addition to the elements of the thermal system previously described, the embodiment of the invention shown in FIG. 7 includes a control board 60, which may be a type of PCB used to control the LED's in the light box 58. A fan 62, similar to the fan 50 or 50', is attached to the control board 60 proximate a rear portion 64 of the housing 66 enclosing the LED's and elongate heat dissipating members. In the embodiment shown in FIG. 7, the fan 62 uses only a small area of the rear portion 64, but still pulls air from a front portion 68 of the housing 66 as illustrated by the directional arrows.

Figure 8:
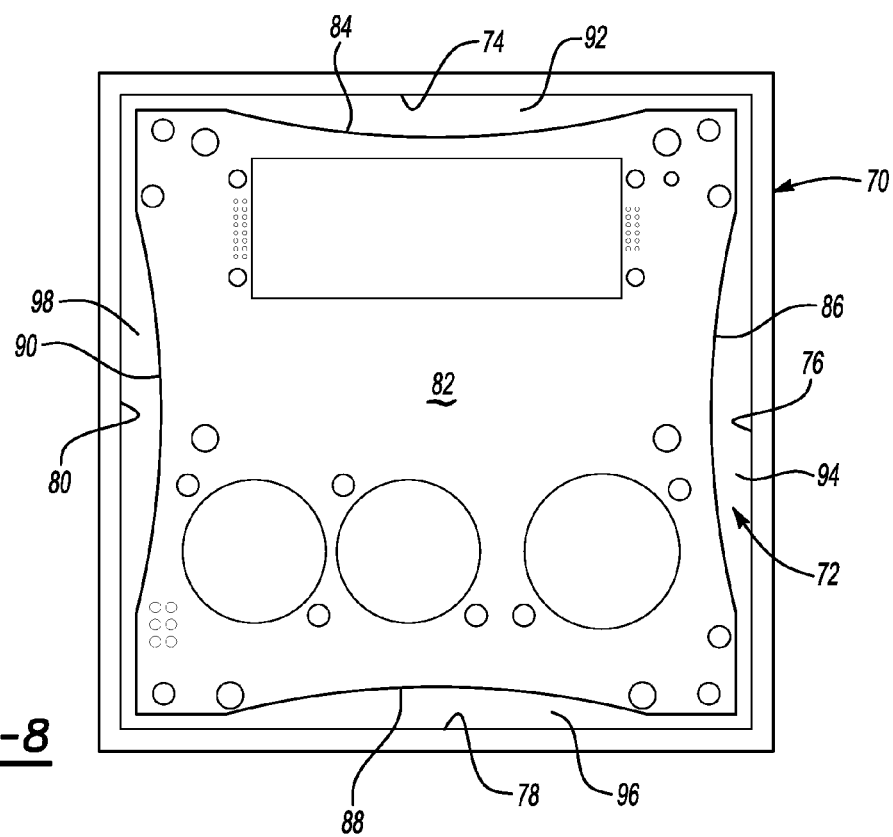
FIG. 8 is a plan view of a rear of a housing such as shown in FIG. 7, and a control board configured to allow air movement between the edges of the board and the interior walls of the housing.

In some embodiments, it may be convenient to dispose a fan in an interior portion of a housing, such as the fan 50' in the housing 46 shown in FIG. 6. In such a case, a control board, such as the control board 60 shown in FIG. 7 might impermissibly impede the flow of air exiting the housing. FIG. 8 illustrates an embodiment of the invention that addresses this issue. FIG. 8 shows a plan view of a housing 70 having an interior space 72 defined by interior walls 74, 76, 78, 80. A control board 82 is disposed toward a rear portion of the housing 70, similar to the illustration in FIG. 7 where the control board 60 is disposed near the rear portion 64 of the housing 66. In the embodiment shown in FIG. 8, there is no fan attached to the control board 82. Rather, a fan, such as the fan 50' shown in FIG. 6, is disposed behind the control board 82 between the control board 82 and a PCB, such as the PCB 44 shown in FIG. 6. To facilitate movement of warm air out of the housing 70, the control board 82 is configured such that four of its edges 84, 86, 88, 90 are configured to cooperate with respective interior walls 74, 76, 78, 80 of the housing 70 to form fluid ducts 92, 94, 96, 98. The fluid ducts 92-98 provide passageways for the air moved by a fan to exit the housing 70. Alternatively, or in conjunction with the fluid ducts 92-98, the control board 82 can be configured with one or more through-holes to facilitate movement of air out of the housing 70.

Figure 9:
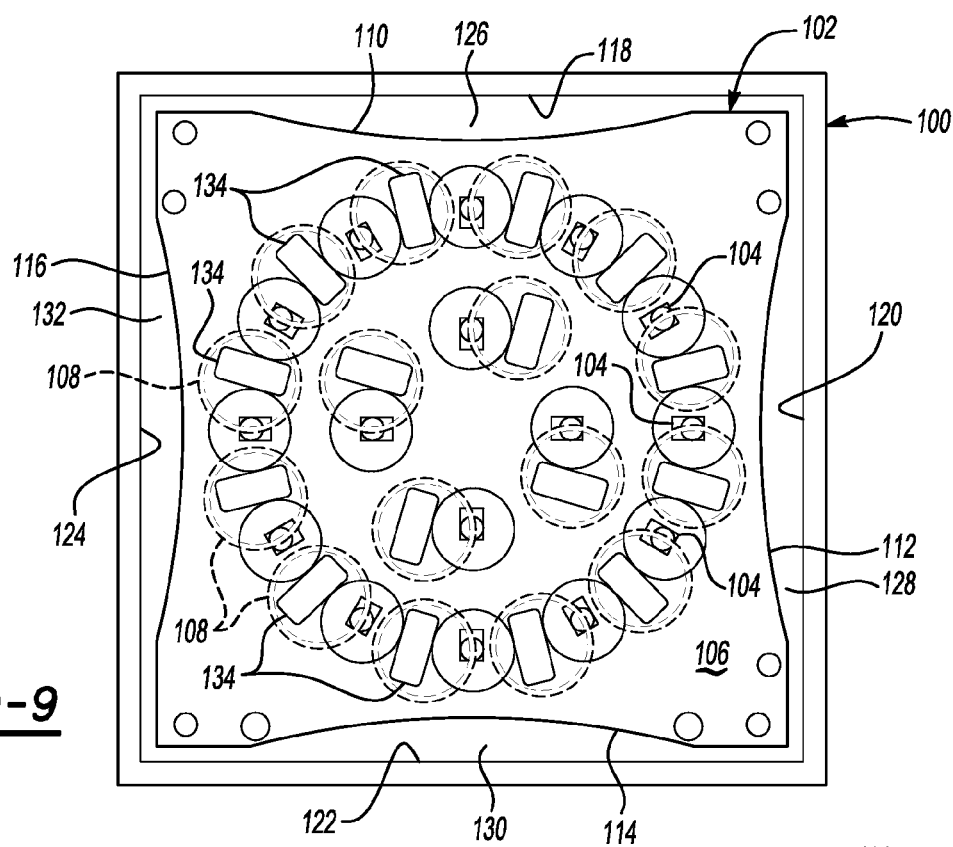
FIG. 9 is a plan view of a thermal management system in accordance with an embodiment of the present invention having a PCB configured to allow movement of air between the PCB and the interior walls of a housing, and further having non-circular apertures disposed therethrough to facilitate air flow through the interior portions of the elongate members.

A similar configuration can be used for the PCB that contains the electrical components. FIG. 9 shows a housing 100 having a PCB 102 disposed therein. The PCB 102 has a plurality of electrical components 104 attached to a first surface 106 of the PCB 102. On the opposite side of the PCB 102 are mounting pads 108 used for mounting heat dissipating tubes as described above. Four of the edges 110, 112, 114, 116 of the PCB 102 are configured to cooperate with respective interior walls 118, 120, 122, 124 of the housing 100 to form fluid ducts 126, 128, 130, 132. The fluid ducts 126-132 may allow some of the air moved by a fan, for example the fan 50 shown in FIG. 5, to be pulled from the first side 106 of the PCB 102 to the second side of the PCB 102 and out a rear portion of the housing 100. Associated with each of the mounting pads 108 are apertures 134, which are generally rectangular, rather than circular as illustrated and described above.

Figure 10:
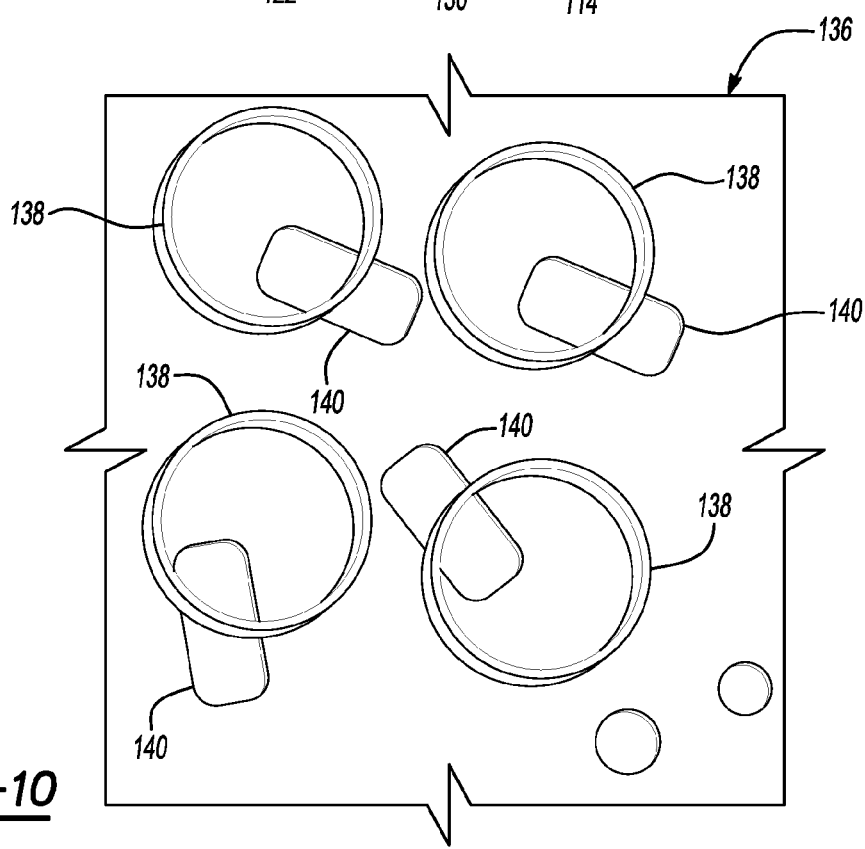
FIG. 10 is a plan view of a portion of a thermal management system in accordance with an embodiment of the present invention having a PCB with apertures partially disposed within the boundaries of heat dissipating members.
Figure 11:
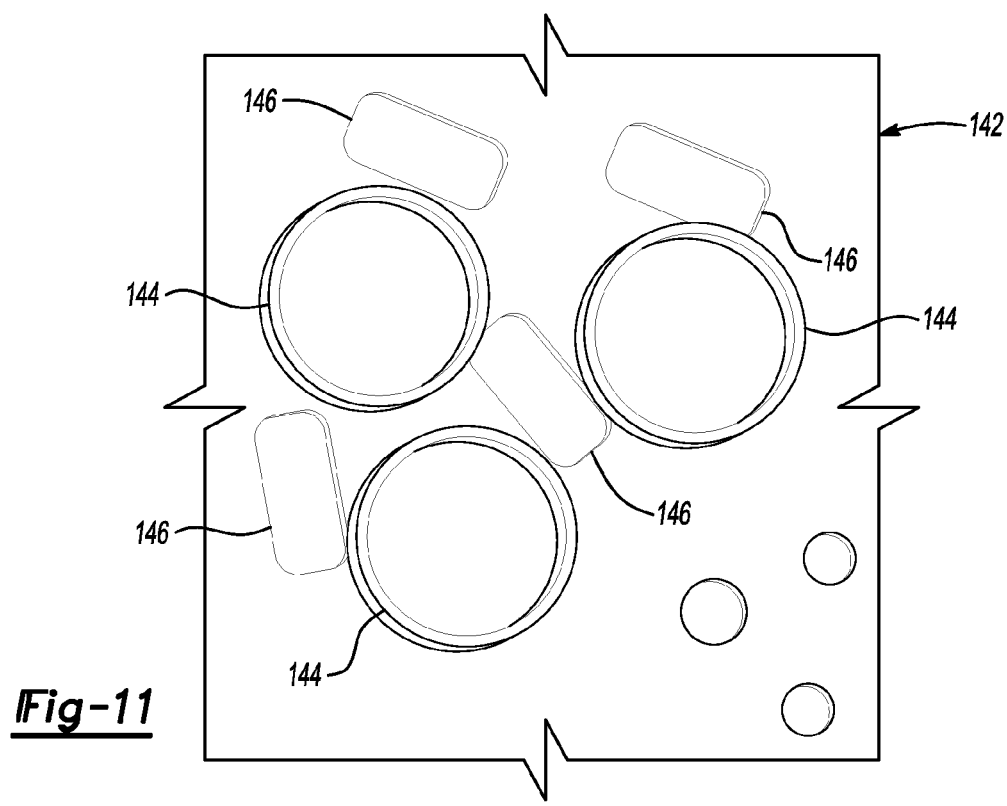
FIG. 11 is a plan view of a portion of a thermal management system in accordance with an embodiment of the present invention having a PCB with apertures disposed completely outside the boundaries of heat dissipating members.
Figure 12:
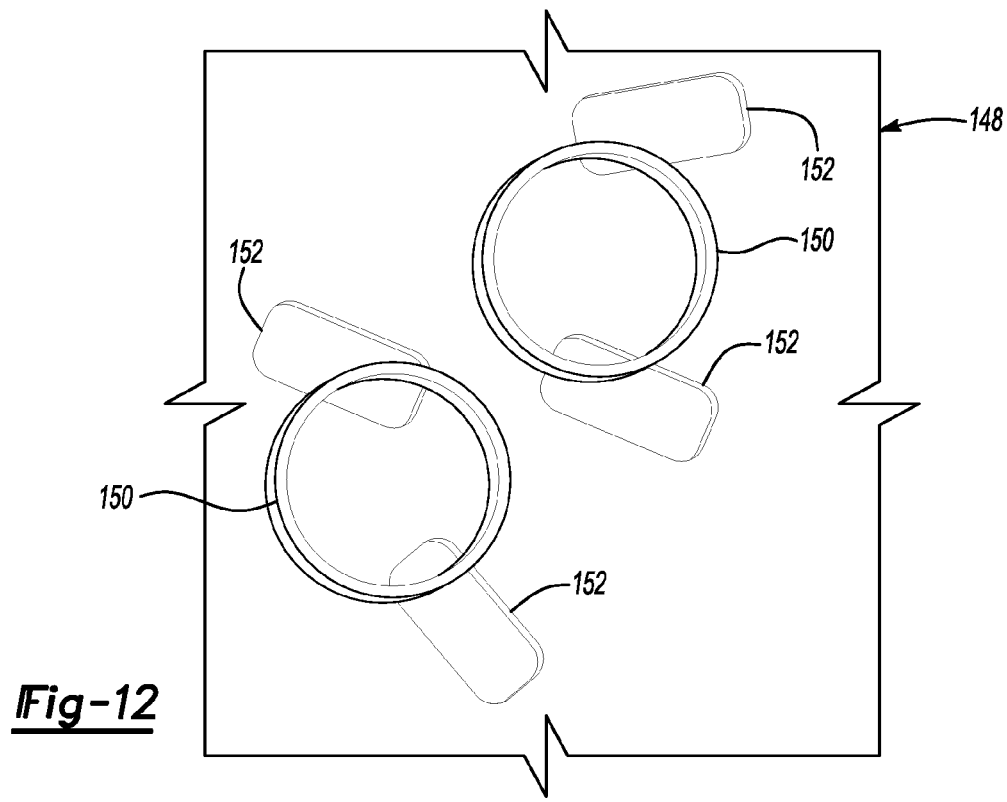
FIG. 12 is a plan view of a portion of a thermal management system in accordance with an embodiment of the present invention having a PCB with multiple apertures cooperating with each heat dissipating member.

FIG. 10 shows a top view of a portion of a PCB 136 having heat dissipating elongate members 138, and apertures 140. The apertures 140 are partially within the boundary formed by the outside of the elongate members 138, and air flowing through them will flow along inside and outside surfaces of the elongate members 138. In FIG. 11, a PCB 142 includes elongate members 144 and apertures 146, which are disposed completely outside of the interiors of the elongate members 146. This facilitates air flow through the apertures and along the outer surfaces of the elongate members 144. Because of the relative positioning of the elongate members 144 and apertures 146, at least some of the apertures 146 provide air flow to more than one of the elongate member 144. In a variation of the PCB 142 shown in FIG. 11, the PCB 148 shown in FIG. 12 has heat dissipating elongate members 150 and apertures 152. Each of the elongate members 150 contacts air moving through more than one of the apertures 152, which can increase heat dissipation—the rate and overall amount—in the elongate members 150.

Figure 13:
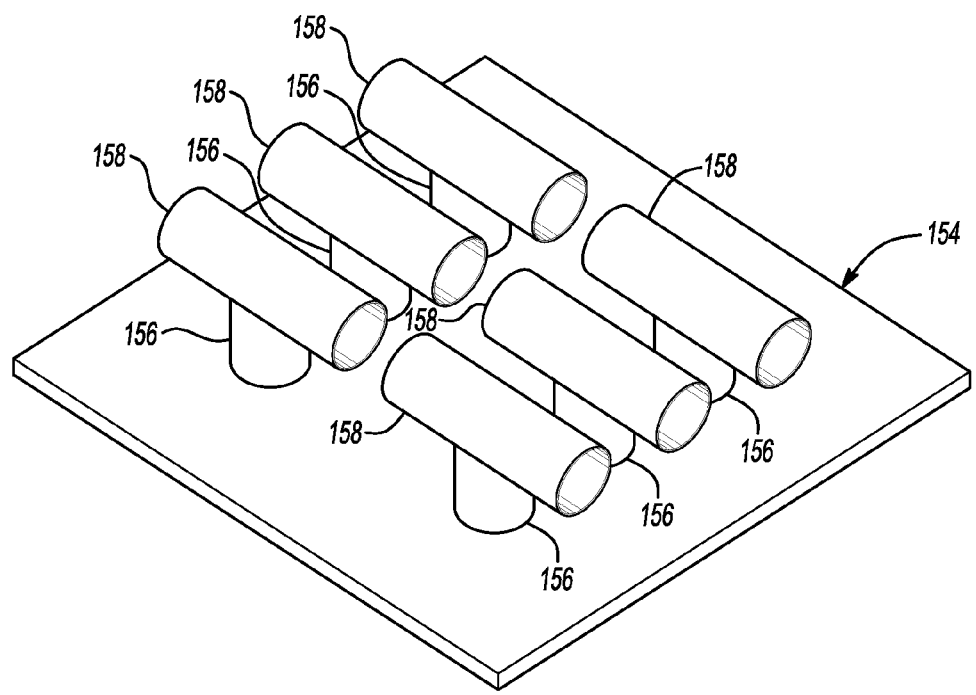
FIG. 13 is a perspective view of a portion of a thermal management system in accordance with an embodiment of the present invention having a PCB with heat dissipating members having cross members attached thereto.
Figure 14:
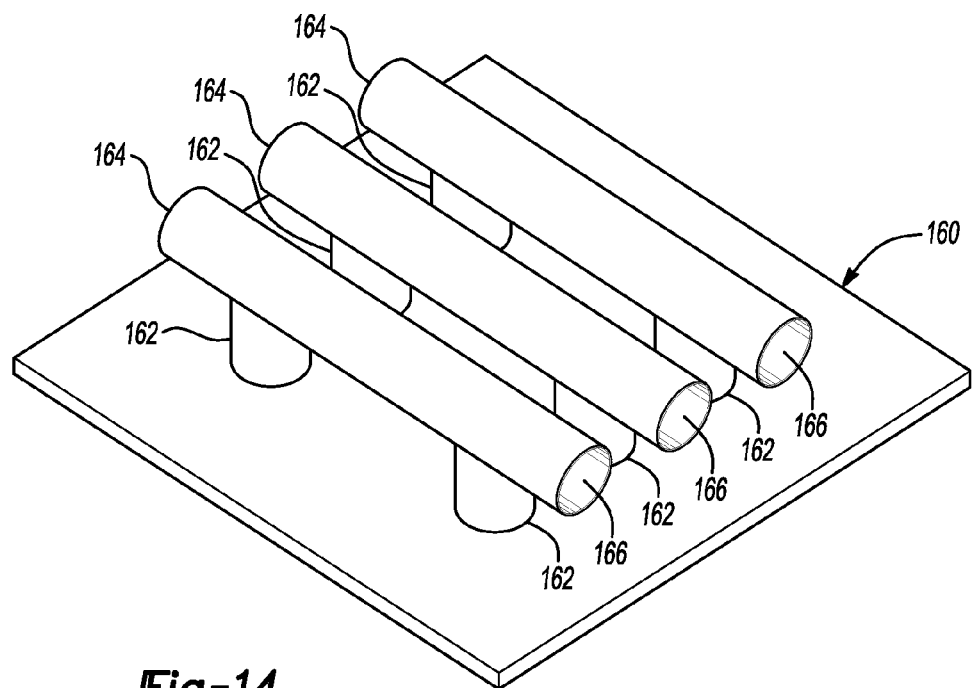
FIG. 14 is a perspective view of a portion of a thermal management system in accordance with an embodiment of the present invention having a PCB with multiple heat dissipating members having a single cross member attached thereto.

FIG. 13 shows a PCB 154 having heat dissipating elongate members 156, each of which is attached to a cross member 158. In the embodiment shown in FIG. 13, the elongate members and cross members are configured as tubes having open interiors that are in fluid communication with each other. This may facilitate heat dissipation, particularly where air is flowing transversely to the axis of the elongate members 156. FIG. 14 shows a PCB 160 having heat dissipating elongate members 162 and cross members 164. In this embodiment, a single cross member 164 is attached to two elongate members 162. Although the cross members 164 are also configured as tubes having open interiors 166, other configurations of cross members may be used, including flat stock or other solid, non-tubular members.

The present invention also includes a method for producing a thermal management system for an electrical component such as described above. In some embodiments, an elongate heat dissipating member is attached to a side of a PCB, opposite a predetermined location of where an electrical component is to be mounted; of course, if the electrical component is already mounted on the PCB, then the elongate member is attached opposite the electrical component as well as the predetermined location. If the electrical component is not already attached to the PCB, it may be after the elongate member is attached. In fact, more than one electrical component may be attached opposite a single elongate member, for example, to save space. In attaching the elongate member, a first end may be attached to the PCB, for example, via a surface mounting technique. In at least some embodiments, the elongate member is attached to the PCB using a heat conductive mounting pad.

The elongate member may have virtually any shape effective to achieve the desired effect. For example, it may have one end attached to the PCB and another end disposed away from the PCB, with an open interior portion. The open interior facilitates fluid communication—for example, air flow—between the two ends. An aperture may be disposed in the PCB such that it at least partially opens into the interior of the elongate member. Embodiments of the invention may have a more than one elongate member, with an aperture or apertures associated with each, or a single aperture can be used for more than one elongate member.

In addition to the foregoing, embodiments of the invention may include the steps of disposing the PCB within a housing, and disposing a fan within the housing in a position whereby the fan is operable to move air through the aperture or apertures and through the elongate member or members. As discussed above, this can be achieved by mounting a fan proximate the side of the PCB containing the elongate members and pulling air through the apertures and then through the interiors of the elongate members. Alternatively, the fan can push air through the interiors first and then through the apertures. In some embodiments, where the electrical components are not LED's that require an unobstructed path to illuminate a space outside the housing, the fan may be placed proximate the side of the PCB with the electrical components—i.e., on the side opposite the elongate members.

Embodiments of the invention may also include the step of configuring a control board, the PCB with the electrical components, or both, to provide air flow paths around their outside edges. For example, the method may include forming a portion of one or more edges of the control board or PCB such that it forms a fluid duct with an interior wall of the housing when mounted therein. In this way, air moved by the fan will not only go through the elongate members and through the apertures, but will also go around the edge of the board. A configuration of this type allows a control board to be disposed between the fan and the portion of the housing where the air is exhausted.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A thermal management system for an electrical component, comprising:
    a printed circuit board (PCB) having a first side; and
    an elongate member separate from a fan housing including one end attached to a second side of the PCB, another end disposed away from the PCB, and an open interior facilitating fluid communication between the two ends, the one end defining an at least partially closed boundary on the PCB,
    the PCB including an aperture disposed therethrough proximate the boundary such that fluid communication is facilitated between the first side of the PCB and the second side of the PCB, and along at least a portion of the elongate member.

2. The system of claim 1, wherein the aperture is disposed at least partially within the boundary such that fluid communication is facilitated between the first side of the PCB and the second side of the PCB, and through the interior of the elongate member.

3. The system of claim 1, wherein the electrical component is disposed at a predetermined location on the first side of the PCB, directly opposite at least a portion of the boundary defined on the second side of the PCB.

4. The system of claim 3, wherein the one end of the elongate member is attached to the PCB with a heat conductive material to facilitate conductive heat transfer from the electrical component through the PCB and into the elongate member.

5. The system of claim 1, further comprising:
   a housing including at least one interior wall and having the PCB disposed therein; and
   a fan disposed within the housing for moving air at least through the aperture and along at least a portion of the elongate member.

6. The system of claim 5, further comprising a control board operatively connected to the PCB for controlling the electrical component, the control board being disposed within the housing such that at least one fluid duct is formed between a respective edge of the control board and a corresponding interior wall of the housing such that air moved by the fan can exit the housing after traversing the at least one fluid duct.

7. The system of claim 5, wherein the PCB has a plurality of the electrical components disposed thereon, each of the electrical components including a light emitting diode (LED), the housing further including:
   an at least partially open front portion allowing light from the LED's to illuminate a space outside the housing, and
   an at least partially open rear portion allowing air moved by the fan to exit the housing.

8. The system of claim 1, further comprising a cross member in heat conductive contact with the end of the elongate member disposed away from the PCB.

9. The system of claim 8, wherein the cross member includes an open interior in fluid communication with the open interior of the elongate member.

10. A thermal management system for an electrical component, comprising:
    a printed circuit board (PCB) having at least one of the electrical components surface mounted on a first side of the PCB;
    at least one mounting pad disposed on a second side of the PCB directly opposite at least one of the electrical components; and
    at least one elongate member surface mounted along a respective mounting pad and including a respective open interior facilitating fluid communication therethrough,
    the PCB including at least one aperture disposed therethrough proximate at least one respective mounting pad such that fluid communication is facilitated between the first side of the PCB and the second side of the PCB, through the at least one aperture, and along at least a portion of at least one respective elongate member.

11. The system of claim 10, wherein the at least one aperture is disposed at least partially within at least one respective mounting pad such that fluid communication is facilitated between the first side of the PCB and the second side of the PCB, through the at least one aperture, and through the interior of the at least one respective elongate member.

12. The system of claim 11, wherein a plurality of the electrical components are surface mounted on the first side of the PCB and a plurality of the elongate members are surface mounted on the second side of the PCB along respective mounting pads,
    the mounting pads including a heat conductive material to facilitate conductive heat transfer between the electrical components and respective elongate members,
    the PCB including a plurality of the apertures associated with respective mounting pads to facilitate fluid communication from the first side of the PCB through the interiors of the elongate members.

13. The system of claim 12, further comprising:
    a housing having the PCB disposed therein; and
    a fan disposed within the housing for moving air at least through the apertures and through the interiors of the elongate members.

14. The system of claim 13, wherein the elongate members are generally tubular, each having:
    a cross section forming a closed polygon,
    a first end attached to a respective mounting pad, and
    a second end disposed away from the PCB and open to an ambient environment.

15. The system of claim 14, wherein at least some of the electrical components include a light emitting diode (LED), the housing including a front portion allowing light from the LED's to illuminate a space outside the housing, and a rear portion allowing air moved by the fan to exit the housing.

16. The system of claim 15, wherein the PCB is a non-metal core PCB.

17. The system of claim 15, wherein the housing includes an interior space at least partially defined by a plurality of interior walls, the system further comprising a control board operatively connected to the PCB for controlling the LED's, the control board being disposed within the housing such that at least one fluid duct is formed between a respective edge of the control board and a corresponding interior wall of the housing such that air moved by the fan can exit the housing after traversing the at least one fluid duct.

18. A method for producing a thermal management system for an electrical component attached to a printed circuit board (PCB) at a predetermined location on a first side of the PCB, the method comprising:
    surface mounting along a heat conductive mounting pad a first end of an elongate member on a second side of the PCB opposite the predetermined location, the first end defining an at least partially closed boundary on the first side of the PCB, the elongate member including a second end disposed away from the PCB and an open interior facilitating fluid communication between the two ends; and
    disposing an aperture through the PCB proximate the boundary such that fluid communication is facilitated between the first side of the PCB and the second side of the PCB, and along at least a portion of the elongate member.

19. The method of claim 18, wherein the step of disposing an aperture through the PCB proximate the boundary includes disposing the aperture at least partially within the boundary, thereby facilitating fluid communication between the first side of the PCB and the second side of the PCB, and through the interior of the elongate member.

20. The method of claim 18, further comprising:
    disposing the PCB within a housing; and
    disposing a fan within the housing to move air at least through the aperture and through the interior of the elongate member.

21. The method of claim 18, the thermal management system further including a housing having an interior space at least partially defined by a plurality of interior walls, the method further comprising:
    disposing a control board within the housing such that the control board has at least one edge that cooperates with a respective interior wall of the housing to form a fluid duct.

* * * * *

UNITED STATES PATENT AND TRADEMARK OFFICE
CERTIFICATE OF CORRECTION

| | |
|---|---|
| PATENT NO. | : 8,767,398 B2 |
| APPLICATION NO. | : 13/021344 |
| DATED | : July 1, 2014 |
| INVENTOR(S) | : Robert E. Kodadek, III |

It is certified that error appears in the above-identified patent and that said Letters Patent is hereby corrected as shown below:

In the Claims

Claim 18, Column 10, line 35:

Replace "on the first" with -- on the second --.

Signed and Sealed this
Thirty-first Day of March, 2015

Michelle K. Lee
*Director of the United States Patent and Trademark Office*